(12) United States Patent
Kawano (10) Patent No.: US 6,205,658 B1
(45) Date of Patent: Mar. 27, 2001

(54) METHOD FOR FORMATION OF METAL WIRING

(75) Inventor: Masaya Kawano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/441,087

(22) Filed: Nov. 16, 1999

(30) Foreign Application Priority Data

Nov. 26, 1998 (JP) .................................................. 10-336245

(51) Int. Cl.⁷ .................................................. H01R 43/00
(52) U.S. Cl. ................................ 29/852; 29/825; 29/847; 427/97
(58) Field of Search ............................ 29/825, 850, 846, 29/847, 852; 427/97; 451/41, 63, 287; 438/687, 659; 204/192.15

(56) References Cited

U.S. PATENT DOCUMENTS

| | | | |
|---|---|---|---|
| 5,413,941 | * 5/1995 | Koos et al. ................................. | 437/8 |
| 5,834,375 | * 11/1998 | Chen ..................................... | 438/692 |
| 5,991,989 | * 11/1999 | Onishi et al. ......................... | 29/25.35 |
| 6,090,696 | * 7/2000 | Jang et al. ............................ | 438/617 |
| 6,100,197 | * 8/2000 | Hasegawa ............................. | 438/687 |
| 6,105,238 | * 8/2000 | Chesnutt et al. ................... | 29/603.14 |

FOREIGN PATENT DOCUMENTS 10-214834   8/1998   (JP) .

* cited by examiner

Primary Examiner—Stephen F. Gerrity
Assistant Examiner—Rhonda E Sands
(74) Attorney, Agent, or Firm—Sughrue, Mion, Zinn, Macpeak & Seas, PLLC (57) ABSTRACT

A metal wiring forming process in which an insulating film is formed on the principal surface of a substrate. Grooves or via holes are formed in the insulating layer and then a barrier film and a metal film in this order are formed on the substrate. Thereafter, the principal surface of the resulting substrate is smoothed until the insulating film is exposed completely and the grooves or via holes are filled with the metal film. The surface smoothing process includes a first polishing stage of conducting chemical mechanical polishing until the surface of the barrier film is exposed, and a second polishing stage of conducting mechanical polishing to polish the whole resulting surface at a constant rate.

7 Claims, 6 Drawing Sheets

(CMP)

FIG.5(d) PRIOR ART (Chemical(Mechanical)Polishing)

FIG.6(a)
PRIOR ART (Chemical Mechanical Polishing)

FIG.6(b)
PRIOR ART

METHOD FOR FORMATION OF METAL WIRING

BACKGROUND OF THE INVENTION

1. Field of the Invention

The present invention relates to a method for formation of metal wiring. More particularly, the present invention relates to a method for formation of metal wiring, which comprises forming, in each groove or via hole formed in the inter-layer insulating film formed on a substrate, a barrier film and a metal film in this order and then flattening the surface of the resulting substrate to fill the groove or via hole with the metal film.

2. Description of the Related Art

As the method for formation of damascene interconnection, etc., there has been employed a method which comprises forming an insulating film on a substrate, forming grooves or the like in the insulating film, filling the grooves with a wiring material to form a wiring, and polishing and flattening the surface of the resulting substrate.

This conventional method is described sequentially on a case of forming a copper wiring. FIGS. 5(a) to 5(d) are sectional views showing the steps employed in the conventional method for formation of damascene interconnection.

Figure 5A:
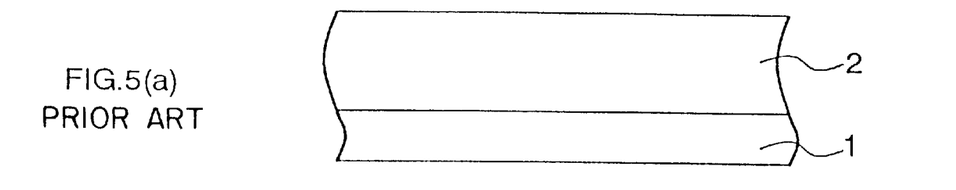
FIGS. 5(a) to 5(d) are sectional views showing the steps of a conventional method for formation of metal wiring using mechanical polishing.
Figure 5B:
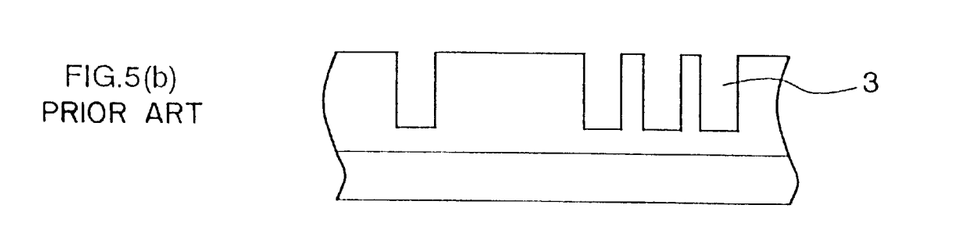

First, an inter-layer film 2 made of $SiO_2$ is formed on a substrate 1 in a thickness of, for example, 1 $\mu$m [FIG. 5(a)]. Successively, grooves 3 having a depth of, for example, 50 nm are formed, by photolithography, at a position of the inter-layer film where a wiring is to be formed [FIG. 5(b)]; then, there is formed, by PVD, a barrier film 4 consisting of a Ta film having a thickness of about 30 nm and a TaN film having a thickness of about 100 nm; further, a copper film 5 is formed in a thickness of about 1 $\mu$m by plating [FIG. 5(c)].

Figure 5C:
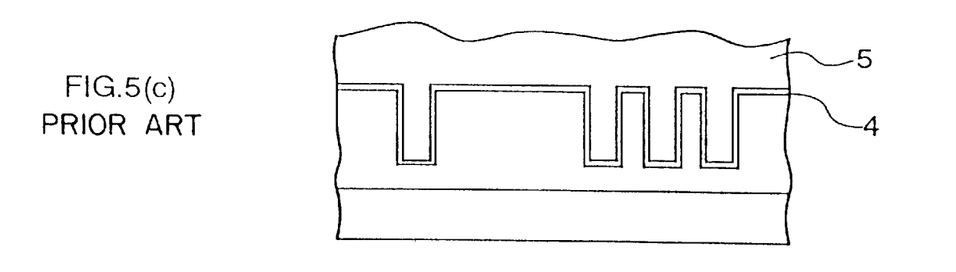

Next, the portions of the copper film 5 and the barrier film 4 present on the inter-layer film 2, other than the film 5 and the film 4 present in the grooves are removed by polishing, for surface flattening.

Figure 5D:
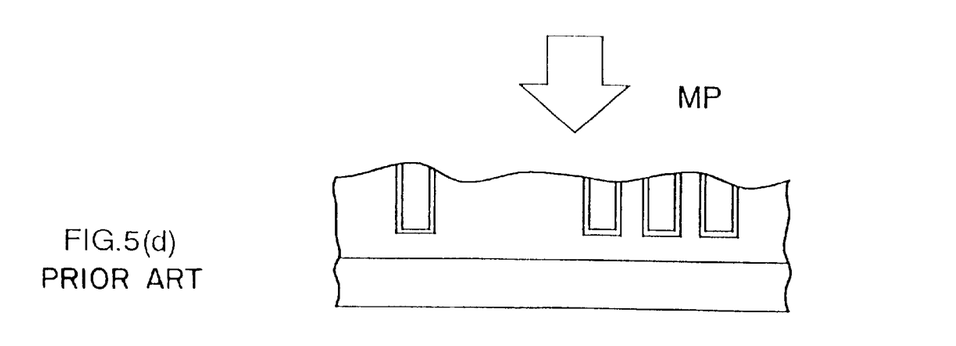

The above polishing may be conducted by mechanical polishing which comprises contacting a to-be-polished surface with a rotating turn table while dropping a solution of abrasive grains onto the surface. With this mechanical polishing, as shown in FIGS. 5(c) and 5(d), the initial non-uniformity (in thickness) of the to-be-polished surface remains per se in the surface after polishing; therefore, when a wiring is formed by plating as in the case of formation of copper wiring, the initial non-uniformity in surface smoothness is high and it is impossible to obtain the flatness required for semiconductor device. Hence, there was proposed chemical mechanical polishing (CMP) which comprises polishing a to-be-polished material while simultaneously applying chemical etching to the material. This CMP is mainly used currently.

Figure 6A:
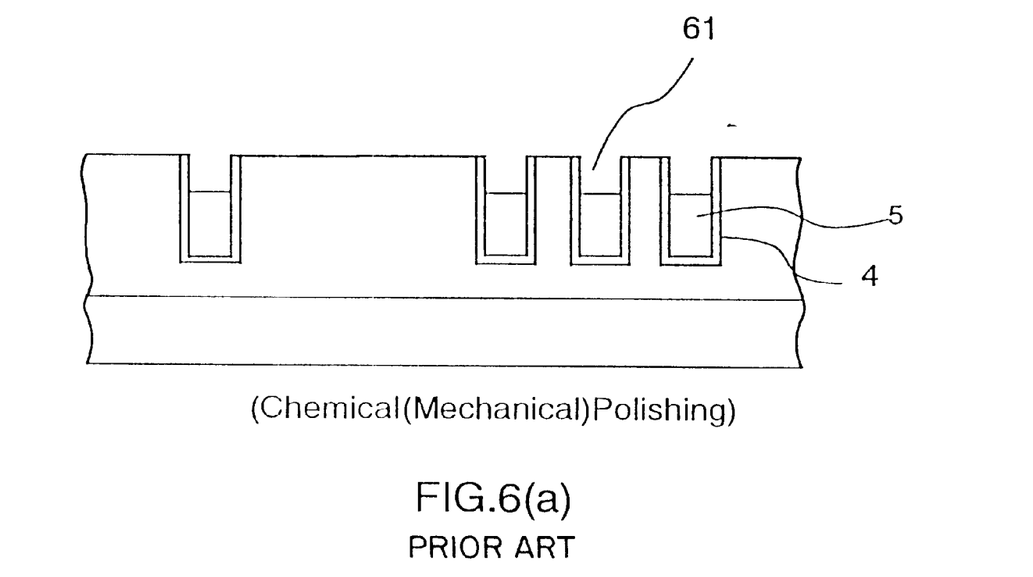
FIGS. 6(a) to 6(b) are schematic views showing the problems of conventional CMP.

In CMP, there is used an abrasive obtained by adding, to a slurry containing abrasive grains (e.g. alumina grains), an acid (e.g. hydrochloric acid) and an oxidizing agent (e.g. hydrogen peroxide); however, it is known that when the polishing rate of wiring material (e.g. copper film) is higher than the polishing rate of barrier film (that is, the factor of chemical etching is large) and when polishing is made in one stage so as to reach the barrier film, the copper film recedes in the grooves and large recesses 61 are generated, as shown in FIG. 6(a). This phenomenon is striking particularly when the polishing rate ratio of copper film and barrier film is high.

Figure 6B:
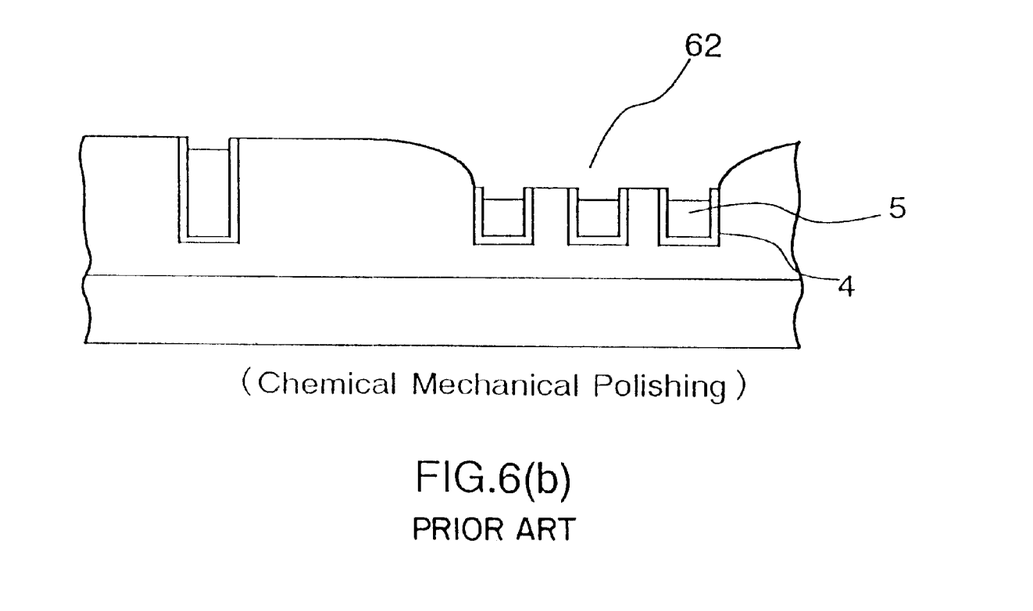

In CMP, there is other problem. That is, when the polishing rate of conductive film is larger than the polishing rate of insulating film, there is a difference in the polishing pressure applied to the surface of insulating film, between the pattern-concentrated region where the wiring pattern is concentrated and the non-pattern region where the wiring pattern is not formed substantially; as a result, the insulating film is polished in a larger amount in the pattern-concentrated region than in the non-pattern region and, as shown in FIG. 6(b), the pattern-concentrated region is dented as a whole and a dent 62 is formed (this phenomenon is called erosion of insulating film).

In CMP, there is further known the following problem. That is, since the oxide film of the pattern-concentrated region is polished mechanically by the abrasive grains (e.g. alumina grains) contained in the abrasive used, for a ling time, the surface of the oxide film of the pattern-concentrated region comes to have a large number of dishings of several tens of micrometers in diameter, or a large number of mars (called microscratches) of about several nanometers to several hundreds of nanometers in depth, depending upon the length of the polishing time.

In order to eliminate the above problems of erosion and microscratches, it is proposed in, for example, JP-A-10-214834 to carry out:

a first polishing stage of contacting chemical mechanical polishing with a first abrasive having a such a polishing rate ratio that the polishing rate of lower conductive film is smaller than the polishing rate of upper conductive film, in order to remove the upper conductive film other than the groove portion but leave the lower conductive film unremoved, and a second polishing stage of conducting chemical mechanical polishing with a second abrasive having such a polishing rate ratio that the polishing rate of lower conductive film is about equal to the polishing rate of insulating film, in order to completely remove the lower conductive film other than the dent portion but leave the insulating film unremoved, to obtain a flat film with no erosion.

However, in the above technique, there is selected in the first polishing stage, an abrasive having such a polishing rate ratio that the polishing rate of lower conductive film is ½ or smaller (⅕ in Examples) of the polishing rate of upper conductive film; with such an abrasive, recesses of no small numbers are generated in the upper conductive film. When in the second polishing stage, CMP is conducted with an abrasive showing about the same polishing rate for oxide film and upper conductive film, the above recesses are per se reflected in the final semiconductor device. Hence, in order to eliminate these recesses, it is necessary to use such an abrasive that the polishing rate of oxide film is slightly larger than the polishing rate of upper conductive film. However, when the polishing rate of oxide film is too large, the upper conductive film comes to project depending upon the depth of the recesses. The presence of such recesses or projections tends to cause accumulation of contaminants at their corners, which gives an adverse effect on the properties of the semiconductor device obtained.

In view of the above situation, it is necessary to select the abrasives used in the first polishing stage and the second polishing stage, so that they have a particular relation, and the selection must be made every time when the materials of upper conductive film, lower conductive film and insulating film as well as the designs thereof are changed. Selection of the optimum combination of abrasives is very difficult and complicated.

Further, since the depth of recess varies in each wiring, the height of wiring varies not only in a single substrate but also between substrates, and this invites serious consequences.

SUMMARY OF THE INVENTION

The object of the present invention is to provide an excellent method for formation of metal wiring, which can eliminate the above-mentioned recess or erosion problem and wherein the selection of the abrasive suitable for the materials to be polished is easy and the formed wirings have the same height in a single substrate and also between a plurality of substrates of the same kind.

According to the present invention, there is provided a method for formation of metal wiring, which comprises at least:

- a step of forming an insulating film on the principal surface of a substrate,
- a step of forming, in the insulating film, grooves or via holes,
- a step of forming, on the whole principal surface of the resulting substrate, a barrier film and a metal film in this order, and
- a step of flattening the principal surface of the resulting substrate until the insulating film is exposed completely, to fill the grooves or via holes with the metal film, wherein the surface flattening consists of:

- a first polishing stage of conducting chemical mechanical polishing until the surface of the barrier film is exposed, and
- a second polishing stage of conducting mechanical polishing to polish the whole resulting surface at a constant rate.

In the present method for formation of metal wiring, since mechanical polishing is employed in the second polishing stage, the selection of abrasive is made only in the first polishing stage. Further, the abrasive used in the first polishing stage is selected so as to have a sufficiently high polishing rate to the upper conductive film. In the present invention, the polishing rate ratio of lower conductive film (barrier film) and upper conductive film (metal wiring material) is 1:5 or more, and the margin of abrasive selection is wide. Furthermore, the second polishing stage need not be changed even when the material combination of the barrier film and the metal wiring is changed, which is very advantageous industrially.

The completion timing of the second polishing stage can be reached by conducting polishing for a predetermined length of time in consideration of the above-mentioned recess factor. In a preferred embodiment of the present invention, a means for determining the completion timing of the second polishing stage in consideration of the recess is formed at positions where no wiring pattern is formed, and the completion timing of the second polishing stage is determined using the means; thereby, a wiring of constant thickness can be formed, there arises no difference in wiring thickness between substrates, and the steps of the present method can be controlled easily.

BRIEF DESCRIPTION OF THE DRAWINGS

FIGS. 3(a) and 3(b) are schematic views of a mechanical polishing machine used in the present invention.

DETAILED DESCRIPTION OF THE PREFERRED EMBODIMENTS

In the first polishing stage of the present invention, CMP is conducted using an abrasive showing a sufficiently higher polishing rate to an upper metal film (a material for wiring) than to a lower barrier film (a conductive film), until the barrier film is exposed completely. In this CMP, a recess is generated on the upper metal film in each groove. In the second polishing stage, mechanical polishing is carried out to a depth at least equal to the bottom of the recess, whereby a substantially flat surface is obtained.

The adhesive used in the first polishing stage can be any abrasive as long as it has a polishing rate sufficiently high to the upper metal film (wiring material); however, there is preferred, in view of the availability and the easiness of detection of polishing completion timing, an abrasive showing an etching rate ratio of barrier film and metal film, of 1:5 or more, preferably 1:10 or more. There is no restriction as to the upper limit of the polishing rate of the metal film; however, since too large a polishing rate of the metal film results in too large a depth of recess, the etching rate ratio need be set at an optimum level depending upon the design of the semiconductor device to be obtained.

In the first polishing stage of the present invention, the thickness non-uniformity of metal film (wiring material) and the in-plane non-uniformity of polishing amount can be allowed to disappear by the polishing where the factor of chemical etching is large; in the second polishing stage, there is carrier out mechanical polishing where no difference in polishing rate between materials exists; thus, flattening with no thickness non-uniformity is made possible. Further in the mechanical polishing, no erosion of insulating film takes place.

Moreover, in the second polishing stage of the present invention, the polishing rate is hardly affected by the kinds of materials to be polished and differs depending upon the polishing conditions such as pressure, abrasive, polishing pad, etc.; therefore, by setting these conditions and conducting polishing for a given length of time, polishing to a desired depth can be carried out. In the mechanical polishing, since no polishing is made for the recesses until the recess bottom (i.e. metal film surface) appears, disappearance of recess becomes possible.

In the present method, the completion timing of the second polishing stage can be determined by forming, in the step of forming an insulating film on a substrate, a means for detection of this completion timing, at positions of the to-be-formed insulating film where no wiring is formed, at the same height as the predetermined height of the wiring and by utilizing this means. Using the means, the completion timing of the second polishing stage can be detected by measuring a torque which changes when the means is exposed, or by using a material of high reflectance in the means and measuring the change of the reflectance.

By using such a means for detection of the completion timing of mechanical polishing, a wiring of constant thickness can be formed, there arises no difference in wiring thickness between substrates, and the steps of the present method can be controlled easily.

The present invention is specifically described below by way of Examples, with reference to FIGS. 1 to 4.

EXAMPLE 1

FIGS. 1(a) to 1(e) are sectional views showing the steps used in one embodiment of the present method for formation of metal wiring. In the present Example, there is described a case of forming a wiring of 500 nm in height.

Figure 1A:
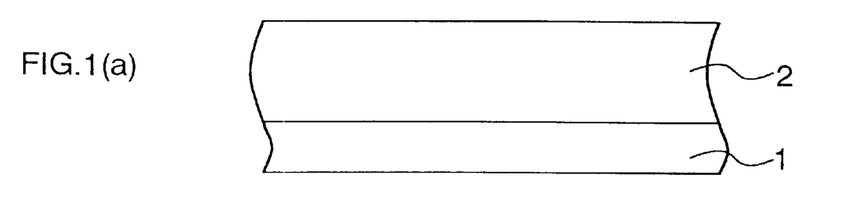
FIGS. 1(a) to 1(e) are sectional views showing the steps of the method for formation of metal wiring according to the present invention.
Figure 1B:
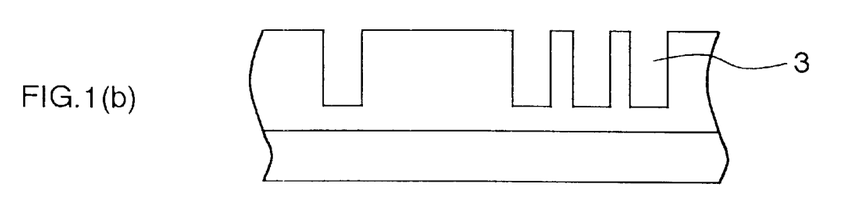
Figure 1C:
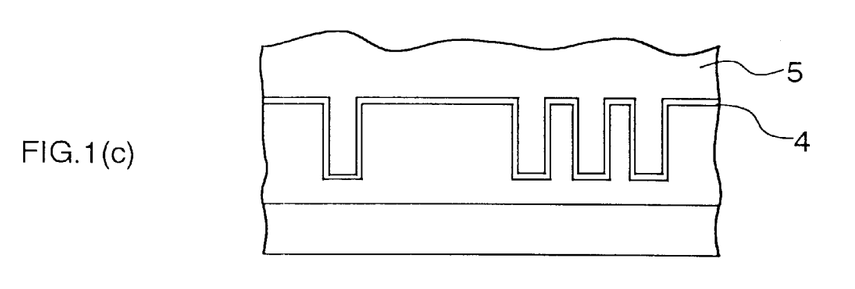
Figure 1D:
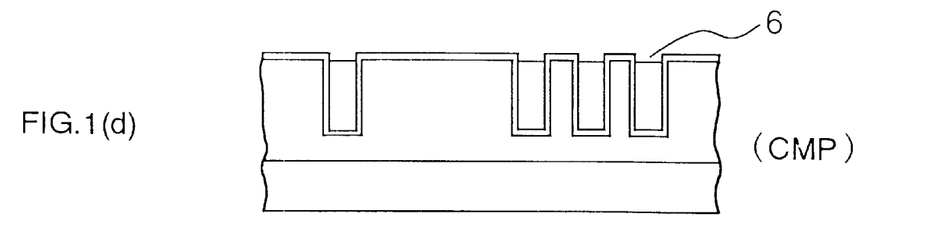

First, an inter-layer film 2 was formed with $SiO_2$ on a substrate 1 in a thickness of, for example, 1 $\mu$m in the same manner as in the conventional technique [FIG. 1(a)]. Successively, grooves 3 of, for example, 550 nm in depth were formed, by photolithography, at positions of the inter-layer film 2 at which a wiring was to be formed [FIG. 1(b)]; then, there was formed, by PVD, a barrier film 4 consisting of a Ta film of about 30 nm in thickness and a TaN film of about 100 nm in thickness; further, a copper film 5 was formed in a thickness of about 1 $\mu$m by plating [FIG. 1(c)].

The thus-produced wafer was mounted on a polishing machine [372M (trade name), a CMP machine produced by IPEC] and subjected to chemical mechanical polishing (CMP) with an abrasive which was a polishing solution obtained by adding nitric acid to an alumina slurry containing alumina particles of 100 to 500 nm in average diameter. The polishing was continued until the barrier film 4 appeared. Incidentally, the polishing rate ratio of the copper film and the barrier film by the above polishing solution was about 10:1. If the polishing rate ratio of the barrier film and the copper film is 1:5 or less, it may occur that even the barrier film is polished depending upon the position of the film and, as a result, the thickness of copper wiring becomes non-uniform and some portions of the copper wiring have a smaller thickness and accordingly a higher resistance. Meanwhile, even if the polishing rate ratio of the barrier film and the copper film is 1:100 or more, no problem occurs in the present invention. When, as in the conventional technique, polishing is conducted only once until the inter-layer film appears, it is necessary that the polishing rate of the barrier film and the polishing rate of the copper film are as close as possible. In the present Example, however, it is desirable that the two polishing rates are different and, in that case, there is no inconvenience of choosing a slurry showing substantially the same polishing rates to the two films. Detection of the completion timing of CMP was made by observing a torque peak using a torque meter fitted to the polishing machine. A first torque peak appeared when the polishing of the copper film started; then, the torque was stable; when the barrier film appeared, a second torque peak appeared; and the timing at which this torque became stabilized, was taken as the completion timing of CMP.

Observation of the wafer surface after CMP indicated slight polishing of the barrier film. In the groove region, the copper film top was lower than the groove top by about 50 to 100 nm (about equal to the thickness of the barrier film) and there was generation of recesses.

Figures 3A, 3B:
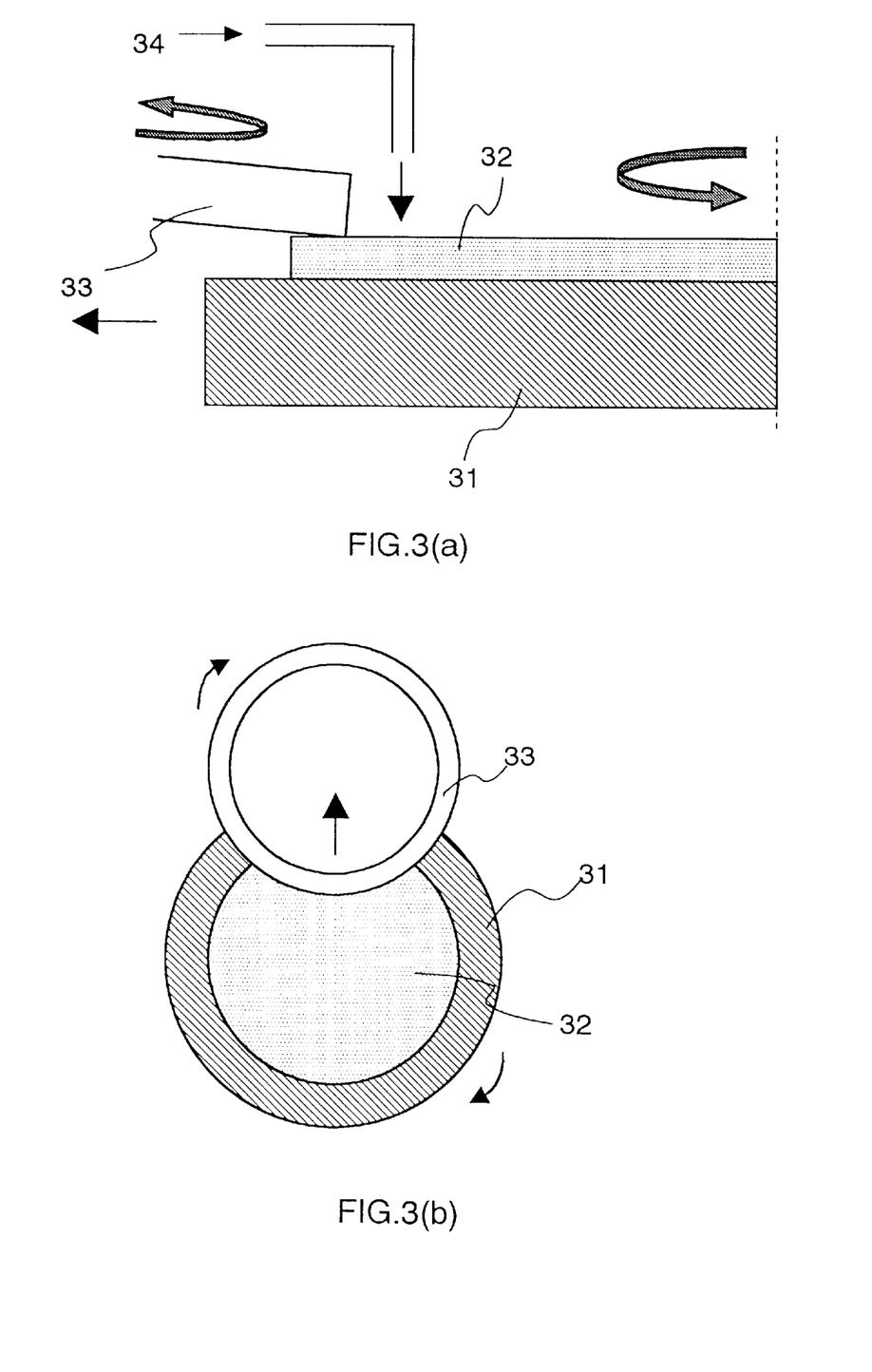
FIG. 3(a) is a sectional view and FIG. 3(b) is a plan view.

Next, mechanical polishing was conducted. In mechanical polishing, polishing is conducted with substantially no difference in polishing rate between copper film and barrier film, using, for example, a polishing machine (HV-9000 produced by Sony) as shown in FIG. 3 [3(a) is a sectional view and 3(b) is a plan view]. In the machine shown in FIG. 3, a wafer 32 is fixed on a polishing stage 31 which rotates at a constant speed; a slurry 34 for ordinary mechanical polishing is dropped onto the wafer 32 at a predetermined rate; the polishing face of a polishing wheel 33 is allowed to abut on the wafer 32 and, in this state, the polishing stage 31 or the polishing wheel 33 or both of them are moved; thereby, the whole wafer surface is polished uniformly.

As the polishing slurry, there is used, for example, a slurry containing silica as abrasive grains, whereby the problem of microscratches in oxide film can be avoided.

In the present Example, mechanical polishing was conducted under the following conditions.

Rotational speed of stage: 60 rpm

Rotational speed of polishing wheel: 300 rpm

Transfer speed: 200 mm/min

Slurry composition: water+(alumina, silica or ceria; or composite thereof)

Figure 4:
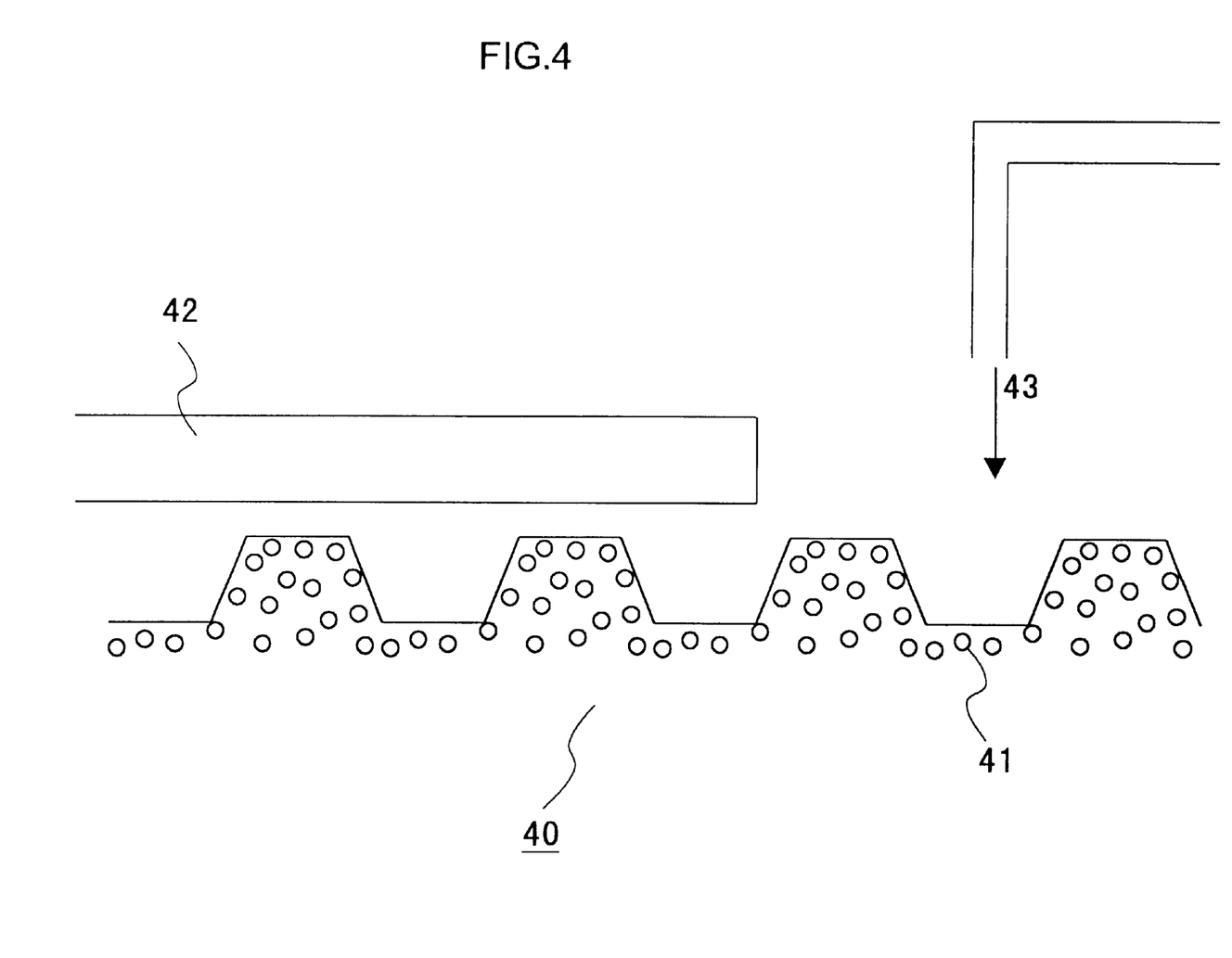
FIG. 4 is a conceptual view showing a polishing pad used in the mechanical polishing stage of the present invention.

Mechanical polishing can also be conducted by, as shown in FIG. 4, using a polishing pad 40 (obtained by binding abrasive grains 41 with a binder) and dropping pure water 43 in place of a slurry, and polishing a wafer 42.

Mechanical polishing is conducted until the barrier film is completely removed and the recesses present on the copper film disappear. In the present Example, in order to achieve an intended wiring height of 500 nm, mechanical polishing was conducted for a predetermined length of time and the oxide film was polished by 50 nm.

Figure 1E:
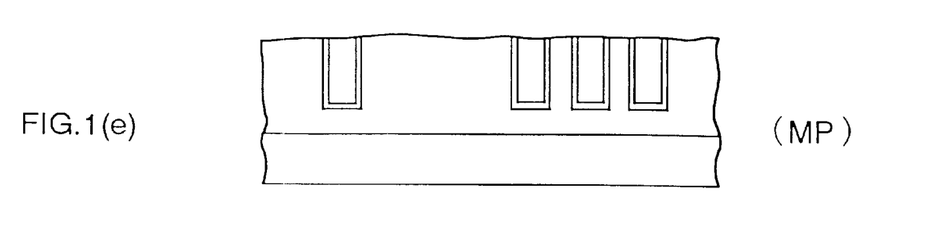

By conducting mechanical polishing as above, a damascene interconnection having a substantially uniform height could be obtained as shown in FIG. 1(e). Further, since it was possible to make the thickness removed by mechanical polishing, slightly larger than the thickness of barrier film, the time required for mechanical polishing could be reduced; as a result, the probability of generation of microscratches or dishings could be significantly reduced.

In the present Example was described a case in which the barrier film had a Ta/TaN stacked structure; however, the barrier film may be a TaN single layer. In the present Example, the wiring material was copper; however, other combination of wiring material and barrier film is possible. For example, the wiring material may be tungsten and the barrier metal may be made of TiN or Ti/TiN.

EXAMPLE 2

In Example 1, the completion timing of mechanical polishing was determined by the control of mechanical polishing time. Example 2 is a case in which the completion timing of mechanical polishing is determined by using a means for detection of the completion timing of mechanical polishing, provided at positions inside wafer where no wiring pattern is formed.

[Production of wafer]

A metal (Al in this Example) 21 for detection of the completion timing of mechanical polishing is formed in a stripe pattern at a height of wiring. This height is lower than the top of the groove because a recess is generated in each groove by CMP. Since the wiring after recess generation is not uniform in height, the metal for detection of completion timing is formed at the minimum wiring height or lower than that. The pattern of the metal 21 is formed by aluminum sputtering and subsequent (lithography+dry etching). Thereafter, there are formed an oxide film, grooves, a barrier film, and a wiring metal film to obtain a wafer as shown in a schematic sectional view of FIG. 2.

[Detection of completion timing]

Figure 2:
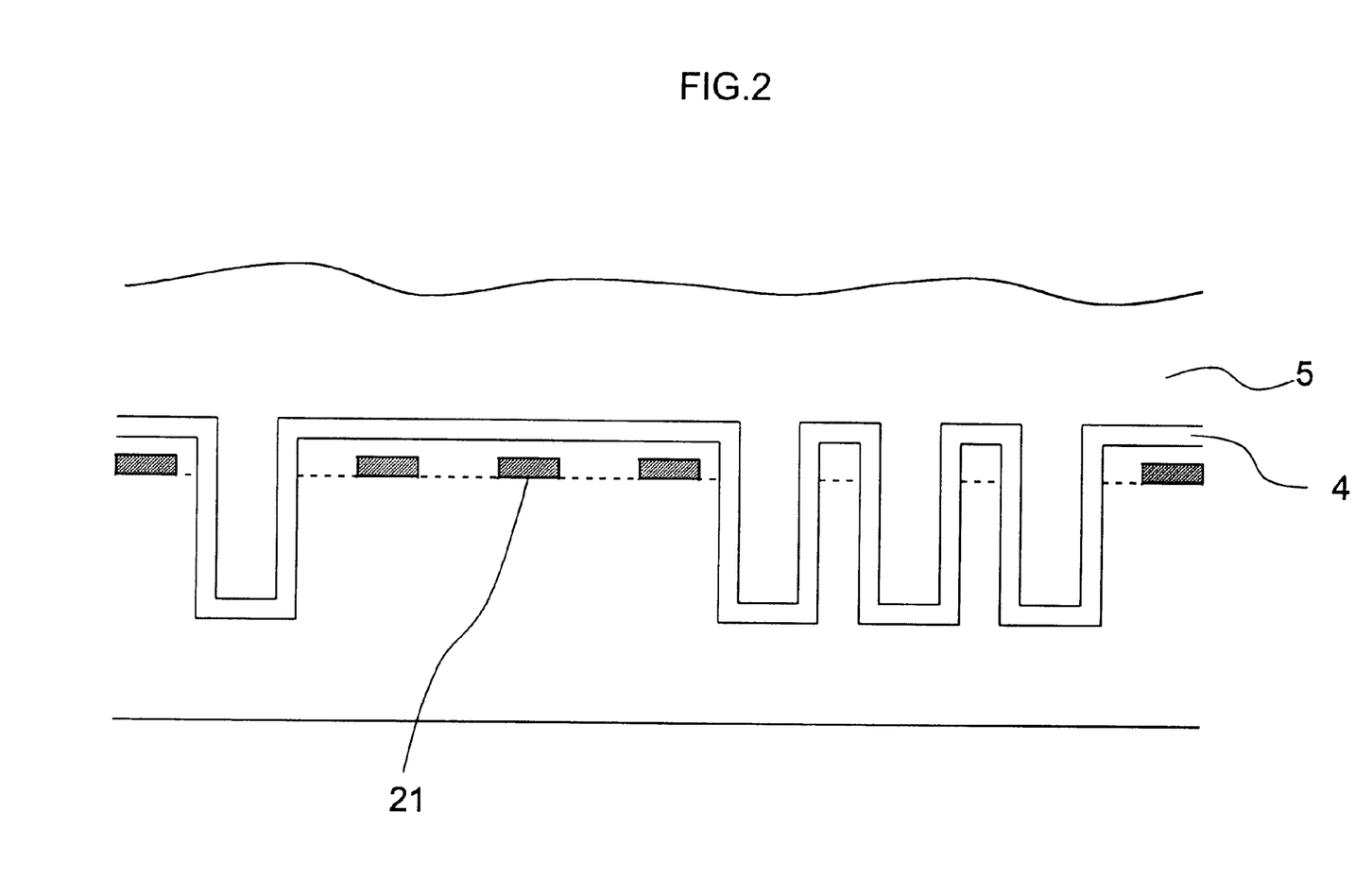
FIG. 2 is a schematic sectional view of a wafer in which the means for detecting the completion timing of the second polishing stage, of the present invention has been provided.

During the mechanical polishing which is a second polishing stage, a light is applied on the wafer and a reflected light is measured. As the mechanical polishing proceeds in the order of the barrier film, the oxide film and the metal for detection of completion timing, the intensity of the reflected light changes; thereby, the amount of polishing can be known during the polishing. When the polishing of the metal for completion timing detection has been over (a position in FIG. 2 shown by a dotted line), mechanical polishing is stopped, whereby a metal wiring having a constant height is obtained. Since the second polishing stage is mechanical polishing, no problem arises even if the metal for completion timing detection and the wiring metal are made of different materials. Thus, the pattern of the metal for completion timing detection can be formed easily by dry etching, and Al of high reflectance can be used as a metal for completion timing detection.

In Example 2, the metal for completion timing detection is Al; however, it may be any other material as long as it enables optical detection of completion timing, has a reflectance different from those of other materials constituting the semiconductor device to be produced, and allows easy formation of detection means.

Detection of the completion timing of mechanical polishing is possible also by measuring the change of torque level.

What is claimed is:

1. A method for formation of metal wiring, which comprises at least:

a step of forming an insulating film on the principal surface of a substrate, a step of forming, in the insulating film, grooves or via holes, a step of forming, on the whole principal surface of the resulting substrate, a barrier film and a metal film in this order, and a step of flattening the principal surface of the resulting substrate until the insulating film is exposed completely, to fill the grooves or via holes with the metal film, wherein the surface flattening consists of:

a first polishing stage of conducting chemical mechanical polishing until the surface of the barrier film is exposed, and a second polishing stage of conducting mechanical polishing to polish the whole resulting surface at a constant rate.

2. A method for formation of metal wiring according to claim 1, wherein as a result of the first polishing stage, a recess is generated on the metal film in each groove or via hole and, in the second polishing stage, polishing is conducted to a depth at least equal to the bottom of the recess.

3. A method for formation of metal wiring according to claim 1, wherein in the mechanical polishing of the second polishing stage, a polishing pad obtained by bonding abrasive grains with a binder is used.

4. A method for formation of metal wiring according to claim 1, wherein in the first polishing stage, an abrasive is used which has a barrier film/metal film polishing rate ratio of 1:5 or more.

5. A method for formation of metal wiring according to claim 1, wherein in the step of forming an insulating film on the principal surface of a substrate, a means for detection of the completion timing of the second polishing stage is beforehand formed at a predetermined wiring height at positions where no wiring pattern is formed.

6. A method for formation of metal wiring according to claim 5, wherein the means for detection of the completion timing of the second polishing stage is made of a material of high reflectance and can detect the completion timing of the second polishing stage by the change of reflectance with the progress of polishing.

7. A method for formation of metal wiring according to claim 1, wherein the metal film filled in each groove or via hole is a copper film.

* * * * *